US012666993B1

(12) United States Patent
Sloane

(10) Patent No.: US 12,666,993 B1
(45) Date of Patent: Jun. 23, 2026

(54) REMOVABLE COVERS FOR AIR CAVITY SURFACE MOUNT PACKAGES

(71) Applicant: CAES SYSTEMS LLC, Arlington, VA (US)

(72) Inventor: Jeffrey Sloane, San Diego, CA (US)

(73) Assignee: CAES Systems LLC, Arlington, VA (US)

( * ) Notice: Subject to any disclaimer, the term of this patent is extended or adjusted under 35 U.S.C. 154(b) by 672 days.

(21) Appl. No.: 18/147,210

(22) Filed: Dec. 28, 2022

(51) Int. Cl.
| | |
|---|---|
| *H10W 74/01* | (2026.01) |
| *H10W 70/60* | (2026.01) |
| *H10W 74/10* | (2026.01) |
| *H10W 70/09* | (2026.01) |
| *H10W 74/00* | (2026.01) |

(52) U.S. Cl.
CPC ....... *H10W 74/019* (2026.01); *H10W 70/614* (2026.01); *H10W 74/124* (2026.01); *H10W 70/09* (2026.01); *H10W 74/00* (2026.01)

(58) Field of Classification Search
CPC . H01L 21/568; H01L 23/315; H01L 23/5389; H01L 24/19; H01L 2224/19; H01L 2924/182
See application file for complete search history.

(56) References Cited

U.S. PATENT DOCUMENTS

2018/0166351 A1* 6/2018 Han ...................... H01L 23/053

* cited by examiner

*Primary Examiner* — Marlon T Fletcher
*Assistant Examiner* — Christina A Sylvia
(74) *Attorney, Agent, or Firm* — Alston & Bird LLP

(57) ABSTRACT

An air cavity surface mount package including a package base, one or more package interconnects disposed at least partially on the package base and a device cover that is temporarily adhered to the package base by an intentionally weak adhesive. The adhesive includes a threshold amount of low strength adhesive material to allow for the non-damaging removal of the device cover from the air cavity surface mount package.

16 Claims, 4 Drawing Sheets

REMOVABLE COVERS FOR AIR CAVITY SURFACE MOUNT PACKAGES

TECHNICAL FIELD

The disclosed embodiments relate generally to air cavity surface mount packages, and, more particularly, to removable covers for air cavity surface mount packages, and a method of applying and removing such covers.

BACKGROUND

Air cavity surface mount packages can include electrical devices that may be mechanically and/or electrically attached to a host printed circuit board (PCB). The packages may include air cavities formed by a package housing which includes internal electrical components. Conventional air cavity packages include a (i) package base with, in some cases, a carrier substrate on which the internal electrical components are placed and (ii) a device cover that is permanently attached to the package base and/or the carrier substrate thereof. Applicant has identified a number of deficiencies and problems associated with conventional air cavity package implementations. Through applied effort, ingenuity, and innovation, many of these identified problems have been solved by developing solutions that are included in embodiments of the present disclosure as described in detail herein.

BRIEF SUMMARY

To solve these problems and others, the embodiments of the present disclosure provide example devices and methods of assembly in which a package cover of an air cavity surface mount package is removable. In particular, an air cavity surface mount package may include a removable device cover that is temporarily adhered to a package base and/or carrier substrate thereof of the air cavity surface mount package. The removable device cover may be adhered to the package base and/or carrier substrate thereof during refinishing (e.g., termination refinishing in which a coating may be applied to a package's metal interconnects) and/or pick and place operations to enable the use of refinishing and/or a pick and place (PNP) machines. Once refinished and/or mechanically or electrically attached to a host PCB, the removable device cover may be removed to expose internal electrical components of the air cavity surface mount package such that soldering flux, cleaning materials, and/or other liquids are not trapped by the device cover after the fabrication, refinishing, and/or cleaning of the air cavity surface mount package and/or a host PCB. The removable device cover allows cleaning solvents to remove contamination, and also allows complete and more rapid removal of said solvents and rinsate during the rinsing and drying process.

In accordance with one embodiment of the present disclosure, an air cavity surface mount package is provided. The air cavity surface mount package comprises a package base; one or more package interconnects disposed at least partially on a carrier substrate of the package base; and a device cover temporarily adhered to the package base. The device cover is temporarily adhered to the package base by an adhesive. The adhesive comprises a threshold amount of a low strength adhesive material.

In some embodiments, the adhesive has an adhesive strength that achieves a first threshold adhesive strength without exceeding a second threshold adhesive strength. In such an embodiment, the first threshold adhesive strength is based at least in part on a weight of the air cavity surface mount package and the second threshold adhesive strength is based at least in part on the one or more package interconnects disposed at least partially on the carrier substrate.

In some embodiments, the adhesive strength is at least five times a weight of the air cavity surface mount package and less than a threshold force corresponding to a material strength or an attachment strength of the one or more package interconnects to a host circuit board.

In some embodiments, the threshold amount of low strength adhesive material is based at least in part on a weight of the air cavity surface mount package.

In some embodiments, a type of the low strength adhesive is based at least in part on a weight of the air cavity surface mount package.

In some embodiments, the air cavity surface mount package is electrically attached to a printed circuit board (PCB).

In some such embodiments, at least one of: (i) the threshold amount of low strength adhesive material, or (ii) a type of the low strength adhesive material is based at least in part on a solder joint strength between at least one of the one or more package interconnects and at least one board interconnect of the PCB.

In some such embodiments, at least one of: (i) the threshold amount of low strength adhesive material, or (ii) a type of the low strength adhesive material is based at least in part on an interconnect adhesive strength of the at least one board interconnect.

In some such embodiments, the at least one of: (i) the threshold amount of low strength adhesive material, or (ii) the type of the low strength adhesive material is based at least in part on a package material strength of the at least one package interconnect or a board material strength of the at least one board interconnect.

In some embodiments, the adhesive is disposed proximate to an exterior boundary of the package base.

In some such embodiments, the threshold amount of low strength adhesive material comprises at least two portions of adhesive material. The at least two portions of adhesive material are symmetrically spaced at two boundary positions of the exterior boundary.

In accordance with yet another embodiment of the present disclosure, a method is provided. The method comprises selecting an adhesive for temporarily adhering a device cover to a package base of an air cavity surface mount package; applying the adhesive to temporarily adhere the device cover to the package base of the air cavity surface mount package; and providing the air cavity surface mount package for at least one of refinishing or circuit board assembly.

In some embodiments, the air cavity surface mount package is provided for at least one of: (i) manual circuit board assembly, (ii) robotic circuit board assembly by a pick and place (PNP) machine, or (iii) robotic refinishing using a robotic refinishing machine.

In some embodiments, the air cavity surface mount package is a particular package type of a plurality of package types, selecting the adhesive comprises selecting, during a design phase, the adhesive for the air cavity surface mount package based at least in part on a weight of the air cavity surface mount package, applying the adhesive comprises applying, during an air cavity surface mount package manufacturing phase, the adhesive to temporarily adhere the device cover to the package base of the air cavity surface mount package, and the design phase is performed once for a plurality of manufacturing phases for a plurality of the air cavity surface mount packages of the particular package type.

In some embodiments, the method further comprises electrically attaching the air cavity surface mount package to a host printed circuit board;

In some embodiments, the method further comprises removing the device cover from the package base.

In some embodiments, the method further comprises reattaching the device cover to the package base.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will be appreciated that the scope of the disclosure encompasses many potential embodiments in addition to those here summarized, some of which will be further described below.

BRIEF DESCRIPTION OF THE DRAWINGS

Having described certain example embodiments of the present disclosure in general terms above, reference will now be made to the accompanying drawings. The components illustrated in the figures may or may not be present in certain embodiments described herein. Some embodiments may include fewer (or more) components than those shown in the figures.

Figure 1A:
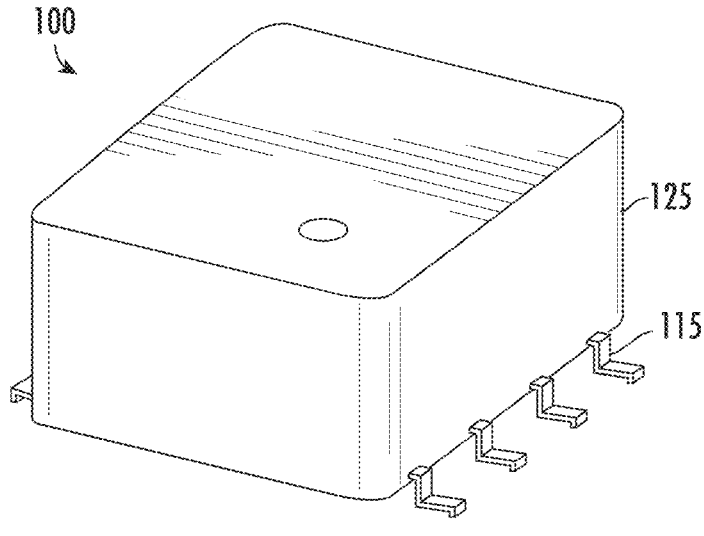
FIGS. 1A-1B illustrate an example air cavity surface mount package which may be used in accordance with some embodiments described herein.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Some embodiments of the present disclosure will now be described more fully hereafter with reference to the accompanying drawings, in which some, but not all embodiments of the disclosure are shown. Indeed, this disclosure may be embodied in many different forms and should not be construed as limited to the embodiments set forth herein; rather, these embodiments are provided so that this disclosure will satisfy applicable legal requirements. Like numbers refer to like elements throughout. As would be evident to one of ordinary skill in the art in light of the present disclosure, the terms "proximate," "substantially," and "approximately" indicate that the referenced element or associated description is accurate to within applicable engineering tolerances.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

As used herein, the phrases "in one embodiment," "according to one embodiment," "in some embodiments," and the like generally refer to the fact that the particular feature, structure, or characteristic following the phrase may be included in at least one embodiment of the present disclosure. Thus, the particular feature, structure, or characteristic may be included in more than one embodiment of the present disclosure such that these phrases do not necessarily refer to the same embodiment.

Numerous details are described herein to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as to avoid obscuring pertinent aspects of the embodiments described herein.

Overview

Surface mount assembly technology may include air cavity surface mount packages in which air cavities are formed by a package housing placed around internal electrical components. The package housing may be formed by a device cover (e.g., a lid or cap) that is permanently attached to a package base (e.g., a frame) of the air cavity surface mount package. The device cover may be used as a flat uniform surface to allow a robotic machine (e.g., refinishing machine, PNP machine, and/or the like) or a manual process to grip (e.g., via a vacuum suction or other securing means) the air cavity surface mount package without interfering with internal electrical components therein. The grip can be sufficient for lifting and/or moving the air cavity surface mount package to facilitate one or more refinishing and/or board fabrication operations. To ensure that the entire package is lifted with a device cover, conventional air cavity surface mount packages may permanently attach the device cover to a package base and/or carrier substrate thereof using a strong epoxy solution. The epoxy solution may affix the device cover to the package base such that it is difficult to remove without damaging the air cavity surface mount package, one or more internal electrical components therein, and/or one or more electrical interconnects of the air cavity surface mount package or a host PCB to which the air cavity surface mount package is attached.

Conventional non-hermetic device packages (e.g., such as non-hermetic air cavity packages) suffer from various shortcomings. For example, while the device cover allows for the handling (e.g., manually, robotically through the use of vacuum handlers, and/or the like) of the air cavity surface mount package, it also captures and holds potentially harmful elements within the air cavity that can cause damage such as corrosion to the internal electrical components within the air cavity over time. Moreover, once attached, device covers prevent inspection of the internal electrical components within the air cavity which reduces options for testing and evaluation of a PCB's performance. Alternative designs may address certain shortcomings by introducing vented device covers that allow potential contamination (e.g., fluxes, dirt, and/or the like) into an air cavity, but also allow the ingress and egress of cleaning solutions and/or rinsate to effectively removing said contamination. However, these designs rely on expensive device covers that are limited to particular air cavity surface mount packages and still prevent inspection of the internal electrical components within the air cavity.

To address these issues and others, embodiments of the present disclosure provide for an air cavity surface mount package with a removably attached device cover. The device cover can be temporarily adhered to a package base of the air cavity surface mount package by an intentionally weak adhesive. The adhesive can include a small amount of a low strength adhesive material such as, for example, a weak room temperature vulcanizing (RTV) material, epoxy, solvent based adhesive, and/or the like. The low strength adhesive material can exert an attachment strength sufficient to enable refinishing and/or pick and place operations, while allowing for the device cover to be removed without damaging an electrical interconnect of the air cavity surface mount package (e.g., solder joints, leads, castellations, pins, etc.) and/or the PCB (e.g., traces, lands, etc.) or impeding an electrical connection between the air cavity surface mount package and the PCB.

Example Air Cavity Surface Mount Package Configuration

Figure 1B:
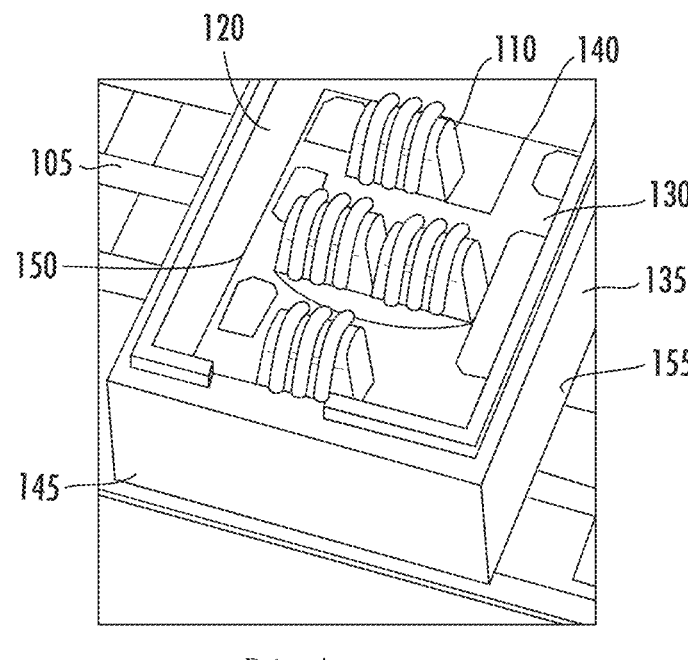

With reference to FIGS. 1A-1B, an example non-hermetic air cavity surface mount package configuration with which the technology disclosed herein may be implemented is depicted. FIGS. 1A-1B, depict an example air cavity surface mount package 100. The example air cavity surface mount package 100 can include an electrical device with one or more electrical components configured to interact with a host PCB 105. The electrical components can include one or more internal electrical components 110 and/or one or more package interconnects 115 (e.g., leads, castellations, and/or any type of metallization). The one or more internal electrical components 110 can be placed within an air cavity 120 of the air cavity surface mount package 100. The air cavity 120 can be formed by a housing of the air cavity surface mount package 100. The housing can be formed by a package cover 125 and a package base 130. In some embodiments, the package base 130 can include a carrier substrate on which the one or more internal electrical components may be disposed. The air cavity surface mount package 100 can include any type of electrical devices such as, for example, a power divider for the host PCB 105.

The device cover 125 can at least partially or fully cover the one or more internal electrical components 110. The one or more package interconnects 115 can at least partially protrude from the air cavity surface mount package 100 to electrically attach the air cavity surface mount package 100 to the host PCB 105. For instance, the one or more package interconnects 115 can include one or more pins, leads, castellations, and/or the like protruding from the housing of the air cavity surface mount package 100 that may be soldered, glued, and/or otherwise attached to one or more board interconnects of the host PCB 105 to electrically couple the air cavity surface mount package 100 to the host PCB 105. The one or more board interconnects, for example, can include one or more landings, traces, and/or the like. In some embodiments, the air cavity surface mount package 100 can include a leadless package. In such a case, one or more package interconnects 115 can include one or more pins, paddles, and/or any other type of non-protruding electrical interconnect for forming an electrical connection with the host PCB 105.

The device cover 125 and the package base 130 can include a single piece of plastic and/or ceramic substrate material. In addition, or alternatively, the device cover 125 can be attached to the package base 130 by an epoxy. By way of example, the device cover 125 can include one or more walls 135 that can be permanently adhered to the package base 130. The epoxy, for example, can include an adhesive material that cannot be easily removed without damaging and/or detaching the air cavity surface mount package 100 from the host PCB 105.

The air cavity surface mount package 100 can include a lip along one or more edges of the package base 130 that separates the package base 130 from the device cover 125. The package base 130 and the device cover 125, for example, can be adhered to each other by an epoxy at one or more locations. The epoxy can be placed along a subset of a plurality of edges of the package base 130 such that the device cover 125 is permanently attached to the package base 130 without forming a complete seal to prevent solvents and/or liquids from entering or leaving the air cavity 120. This can lead to cleaning solvents, fluxes, or other liquids entering and remaining within the air cavity 120 which can cause corrosion and degradation of the one or more internal electrical components 110.

By way of example, an epoxy bead can be placed along a first edge 140 and/or a second edge 145 of the package base 130, but not placed along a third edge 150 and/or a fourth edge 155 of the package base 130. This can cause flux and/or other liquids to enter the air cavity 120 through the separation along the third edge 150 and/or fourth edge 155. By way of example, during cleaning activities, cleaning solution can be applied to a host PCB board which can carry soldering flux into the air cavity 120 of the air cavity surface mount package 200. Such a design can prevent the efficacy of circuit board activities such as cleaning, drying, and/or inspecting activities in which cleaning solvents or other liquids may be used.

Alternative designs may include vented device covers to allow cleaning solvents, fluxes, or other liquids to escape the housing of an air cavity surface mount package. The vented device covers can be designed with one or more archways that extend to the lowest part of the air cavity surface mount package such that liquids can completely drain from the air cavity after cleaning, drying, and/or inspecting activities. Such designs can be expensive to manufacture, require multiple alternative components depending on the air cavity surface mount package, and can reduce visibility of the internal electrical components of the air cavity surface mount package. A removable device cover, as described herein, can overcome each of these disadvantages.

Figure 2:
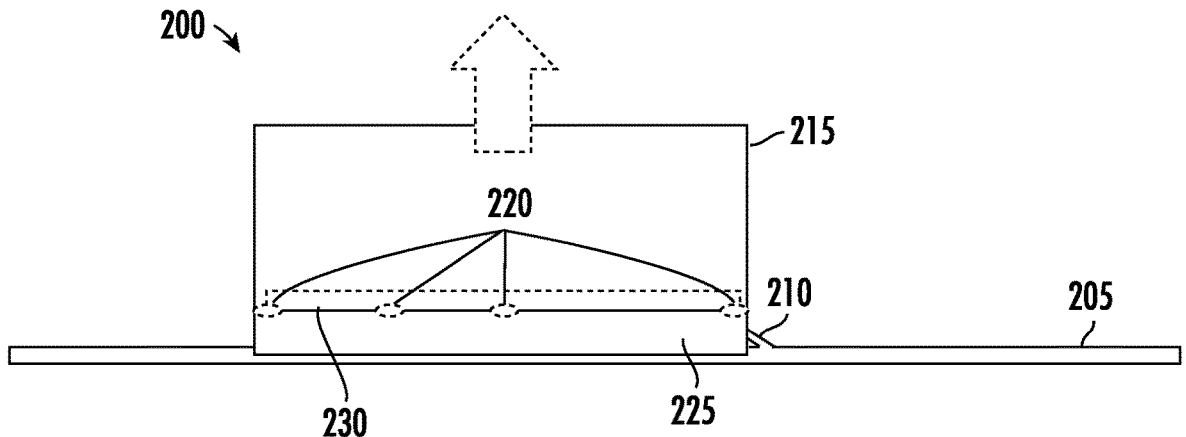
FIG. 2 depicts an example air cavity surface mount package configured with a removable cover in accordance with some embodiments described herein.

FIG. 2 depicts an example air cavity surface mount package 200 configured with a removable cover in accordance with some embodiments described herein. The air cavity surface mount package 200 can include the same air cavity surface mount package 100 described with reference to FIG. 1 or a different air cavity surface mount package depending on the embodiment. By way of example, the air cavity surface mount package 200 can include a power divider and/or any other air cavity package for a host PCB 205. The air cavity surface mount package 200 can be one of one or more air cavity surface mount packages electrically attached to the host PCB 205. In some embodiments, the air cavity surface mount package 200 can be manually positioned on the host PCB 205 and/or robotically positioned on the PCB using a PNP machine.

As shown in FIG. 2, the air cavity surface mount package 200 can include a package base 225, at least one package interconnect 210 disposed at least partially on a carrier substrate of the package base 225, and a removable device cover 215. The removable device cover 215 can be temporarily adhered to the package base 225 by an adhesive 220.

The adhesive 220 can include a threshold amount of low strength adhesive material. The threshold amount of low strength adhesive material can include an intentionally small amount of a weak adhesive material such that it facilitates the non-damaging separation of the removable device cover 215 from the package base 225 after one or more refinishing operations are performed and/or the air cavity surface mount package 200 is placed on the host PCB 205.

The package base 225 can include a package frame, In some embodiments, the package base 225 can include a carrier substrate 230. By way of example, the package base 225 can include a carrier bath and the carrier substrate 230 can be placed inside the carrier bath. According to some embodiments, the carrier substrate 230 can include an insulating layer on which one or more internal electrical components of the air cavity surface mount package 200 can be disposed. The removable device cover 215 can be attached to the package base 225 and/or the carrier substrate 230 of the package base 225 depending on the embodiment.

The removable device cover 215 can be temporarily adhered to the package base 225 to facilitate refinishing operations and/or the manual or robotic placement of the air cavity surface mount package 200. By way of example, the removable device cover 215 can present a flat, uniform surface to facilitate the robotic placement of the air cavity surface mount package on a host PCB 205 using a PNP machine. A PNP machine can include any robotic placement system for robotically placing one or more air cavity surface mount packages at precise locations on a respective host PCB. In some embodiments, PNP machines can include vacuum-based pickup mechanisms for securely lifting and moving the air cavity surface mount package 200. The vacuum-based pickup mechanisms, for example, can include vacuum handlers (e.g., nozzles, etc.) that utilize vacuum suction to secure the air cavity surface mount package. An appropriate vacuum suction can rely on a flat uniform pickup surface which can be provided by the removable device cover 215. Without the removable device cover 215, for example, one or more internal electrical components of a respective air cavity surface mount package may be exposed to the vacuum handler which can prevent sufficient suction for securely lifting and moving the respective air cavity surface mount package in a reliable manner. The removable device cover 215 can provide a flat and uniform surface to enable the reliable PNP placement of the air cavity surface mount package 200 on the host PCB 205.

After placement, the air cavity surface mount package 200 can be electrically attached to the host PCB 205 (e.g., during reflow soldering, etc.). For example, the at least one package interconnect 210 of the air cavity surface mount package 200 can include an electrical connection component that is configured to electrically connect the air cavity surface mount package 200 to the host PCB 205. The electrical connection component, for example, can include one or more electrical wires, leadless surfaces, castellations, and/or the like that may be soldered (or otherwise attached) to the host PCB 205 to electrically connect the air cavity surface mount package 200 to the host PCB 205.

The removable device cover 215 can be removed after the air cavity surface mount package 200 is electrically attached to the host PCB 205. The removable device cover 215, for example, can be removed prior to one or more cleaning, drying, and/or inspecting activities. In this way, the removable device cover 215 can be temporarily attached for facilitating the handling of the air cavity surface mount package 200 during refinishing and/or pick & place/reflow operations and then removed (e.g., discarded, recycled, etc.)

before cleaning/drying/inspecting activities in which flux and/or other liquids may be trapped within an air cavity otherwise created by the removable device cover 215. In this manner, the removable device cover 215 of the air cavity surface mount package 200 enables the washability of the host PCB 205, while maintaining covers for vacuum pickup.

The removable device cover 215 can be disposable, recycled, and/or reattached after removal from the air cavity surface mount package 200. In some embodiments, for example for air cavity surface mount packages with delicate wire bonds and/or that are light-sensitive, the removable device cover 215 can be replaceable after the cleaning, drying, and/or inspecting activities are performed, such as with epoxy, adhesive, or other securing means or mechanism.

By removing the removable device cover 215 during one or more cleaning, drying, and/or inspecting activities, the air cavity surface mount package 200 can expose one or more internal electrical components which can prevent flux and other liquids from remaining within a close proximity to the internal electrical components. This can prevent corrosive and other damaging impacts to the one or more internal electrical components. In addition, the removable device cover 215 can increase the inspectability of the one or more internal electrical components of the air cavity surface mount package 200 after the air cavity surface mount package 200 is mounted to the host PCB 205. This can improve maintenance, testing, and/or other activities for the host PCB 205.

The adhesive 220 can be based at least in part on one or more characteristics of the air cavity surface mount package 200 and/or host PCB 205. The adhesive 220, for example, can apply an adhesive strength sufficient to withstand forces associated with the robotic and/or manual handling (e.g., through the use of vacuum handlers, and/or any other handling mechanism) of the air cavity surface mount package 200, but not sufficient enough to threaten damage to the host PCB 205, the air cavity surface mount package 200, and/or one or more electrical interconnects (e.g., by causing the solder joints to crack, etc.) of the air cavity surface mount package 200 (e.g., package interconnects 210) and/or the host PCB 205 (e.g., board interconnects) when the cover is removed. An adhesive strength can be defined by an amount of force over an area and can be based on multiple factors including the (i) structural integrity and/or (ii) adhesion property of a type of adhesive and (iii) the amount of adhesive that is applied. Based on these factors, among others, a specific type and amount of adhesive can be selected to adhere a removable device cover to a package base by a specific adhesive strength tailored to an air cavity surface mount package.

The adhesive strength of the adhesive 220 can be based at least in part on the geometry (e.g., size, shape, and/or the like) of the air cavity surface mount package 200. A type of the adhesive 220 (e.g., with a specific structural integrity and/or adhesion properties) and/or a threshold amount of the adhesive 220 can be selected based at least in part on the air cavity surface mount package 200 and/or one or more thresholds associated therewith.

The adhesive 220 can be disposed proximate to an exterior boundary (e.g., a periphery) of the package base 225. For example, the threshold amount of the adhesive 220 can include at least two portions of adhesive material. The at least two portions of the adhesive material can be symmetrically spaced at two boundary positions of the exterior boundary. Each portion can include a small dot (e.g., two, three, four, five, six, seven, eight, etc.) of a low strength adhesive material placed at one or more locations of the package base 225 and/or the removable device cover 215. In some embodiments, the threshold amount of adhesive 220 can be based at least in part on a weight of the air cavity surface mount package 200. For example, the threshold amount of the adhesive 220 can be determined to ensure an adhesive strength that exerts a force (i) sufficient to lift at least two, three, four, five, six, seven, eight, and/or the like times the weight of the air cavity surface mount package 200, but (ii) insufficient to move, damage, or otherwise degrade the performance of the air cavity surface mount package 200, the package interconnects 210, the host PCB 205, the board interconnects, and/or the like.

The adhesive 220 can include a low strength adhesive material. The type of the low strength adhesive material can be based at least in part on the weight of the air cavity surface mount package 200. For example, the adhesive 220 can be determined to ensure an adhesive strength that exerts a force (i) sufficient to lift at least two, three, four, five, six, seven, eight, and/or the like times the weight of the air cavity surface mount package 200, but (ii) insufficient to move, damage, or otherwise degrade the performance of the air cavity surface mount package 200, the package interconnects 210, the host PCB 205, the board interconnects, and/or the like. As some examples, the type of the low strength adhesive material can include an alkoxy chemistry, silicone elastomer such as RTV DOW Corning 3140, 3145, and/or the like.

In some embodiments, the type and/or threshold amount of adhesive 220 can be based on the one or more package interconnects 210 and/or one or more board interconnects of the host PCB 205. By way of example, at least one of: (i) the threshold amount of the adhesive 220, and/or (ii) the type of the adhesive 220 can be based at least in part on the one or more package interconnects 210 which can include, for example, one or more electrical wires, leads, castellations, pins, paddles, and/or the like soldered (and/or otherwise attached) to one or more board interconnects such as, for example, one or more traces, lands, and/or the like of the host PCB 205. In some embodiments, the at least one of: (i) the threshold amount of adhesive 220, and/or (ii) the type of the adhesive 220 can be based at least in part on a material strength and/or attachment strength associated with the one or more package interconnects 210 and/or the one or more board interconnects.

In some embodiments, the threshold amount and type of adhesive 220 can be determined as a function of: (i) the weight of the air cavity surface mount package 200 and/or (ii) the attachment of the air cavity surface mount package 200 to the host PCB 205. By way of example, the threshold amount and type of adhesive 220 can be determined to achieve an adhesive strength that achieves a first threshold adhesive strength (e.g., a minimum adhesive strength) without exceeding a second threshold adhesive strength (e.g., a maximum adhesive strength) for the air cavity surface mount package 200.

The first threshold adhesive strength can be based at least in part on a weight of the air cavity surface mount package 200. For example, the first threshold adhesive strength can be a minimum adhesive strength sufficient to counteract the weight of the air cavity surface mount package 200. The first threshold adhesive strength can be a function of the weight of the air cavity surface mount package 200. In some embodiments, the first threshold adhesive strength can be proximate to two to twenty such as five to ten times the weight of the air cavity surface mount package 200, for example, to enable reliable manual and/or robotic grip such as, for example, via vacuum suction for robotic refinishing and/or pick and placement machines. The first threshold adhesive strength, for example, can be sufficient to counteract at least the weight of the air cavity surface mount package 200, and possibly in addition to one or more acceleration and/or other forces applied to the air cavity surface mount package 200 while the air cavity surface mount package 200 is robotically and/or manually lifted and/or moved.

The second threshold adhesive strength can be based at least in part on the one or more package interconnects 210 disposed at least partially on the air cavity surface mount package 200 and/or one or more board interconnects disposed at least partially on the host PCB 205. The second threshold adhesive strength, for example, can include a maximum adhesive strength defined by a material and/or attachment strength of the one or more package interconnects 210, the one or more board interconnects, and/or between the one or more package interconnects 210 and the one or more board interconnects. In some embodiments, the second threshold adhesive strength can include a maximum strength of one pound per square inch of the air cavity surface mount package.

The material strength of the one or more package interconnects 210 (e.g., a package interconnect material strength) and/or the one or more board interconnects (e.g., board interconnect material strength), for example, can be based at least in part on conductive material (e.g., copper, gold, and/or the like) of each of the respective interconnects. The second threshold adhesive strength can be based at least in part on a minimum force capable of degrading (e.g., cracking, and/or the like) the conductive material of the one or more package interconnects 210 and/or the one or more board interconnects. By way of example, more rigid and/or fragile materials (e.g., gold, and/or the like) can be associated with a lower minimum force than flexible and/or sturdy materials (e.g., copper, and/or the like) and can therefore be associated with a lower second threshold adhesive strength.

The attachment strength for the one or more package interconnects 210 and/or the one or more board interconnects can be based at least in part on the attachment of the one or more package interconnects 210 to the air cavity surface mount package 200 and/or the attachment of the one or more board interconnects to host PCB 205. By way of example, the second threshold adhesive strength can be based at least in part on an interconnect adhesive strength indicative of a minimum force capable of peeling, separating, and/or otherwise moving the one or more package interconnects 210 from the air cavity surface mount package 200 and/or the one or more board interconnects from the host PCB 205. As one example, the second threshold adhesive strength can be less than (e.g., a quarter of) a minimum force capable of pulling a trace, land, and/or any other board interconnect from the host PCB 205.

The attachment strength between the one or more package interconnects 210 and the one or more board interconnects can be based at least in part on a strength of one or more attachment joints (e.g., solder joints, and/or the like) between the one or more package interconnects 210 and the one or more board interconnects. For instance, the attachment strength can include a solder joint strength between at least one of the one or more package interconnects 210 and the at least one board interconnect of the host PCB 205. By way of example, the second threshold adhesive strength can be a function of a material and/or attachment force applied by one or more electrical connections between the air cavity surface mount package 200 and the host PCB 205. For instance, the second threshold adhesive strength can be less than (e.g., a quarter of) a minimum force capable of damaging, breaking, and/or otherwise degrading an electrical connection between the air cavity surface mount package 200 and the host PCB 205. In this way, the second threshold adhesive strength can ensure that the removable device cover 215 can be removed from the air cavity surface mount package 200 after the air cavity surface mount package 200 is attached to the host PCB 205 without damaging the electrical connection between the air cavity surface mount package 200 and the host PCB 205.

The first threshold adhesive strength and the second threshold adhesive strength can ensure that the adhesive 220 provides sufficient adhesion such that the removable device cover 215 does not separate from the package base 225 during the handling of the air cavity surface mount package 200 (e.g., via manual/robotic refinishing operations, pick and place operations, and/or the like), but not enough adhesion to damage electrical components and/or connections of the air cavity surface mount package 200 and/or the host PCB 205 during removal of the removable device cover 215.

Example Method of Assembly

Figure 3:
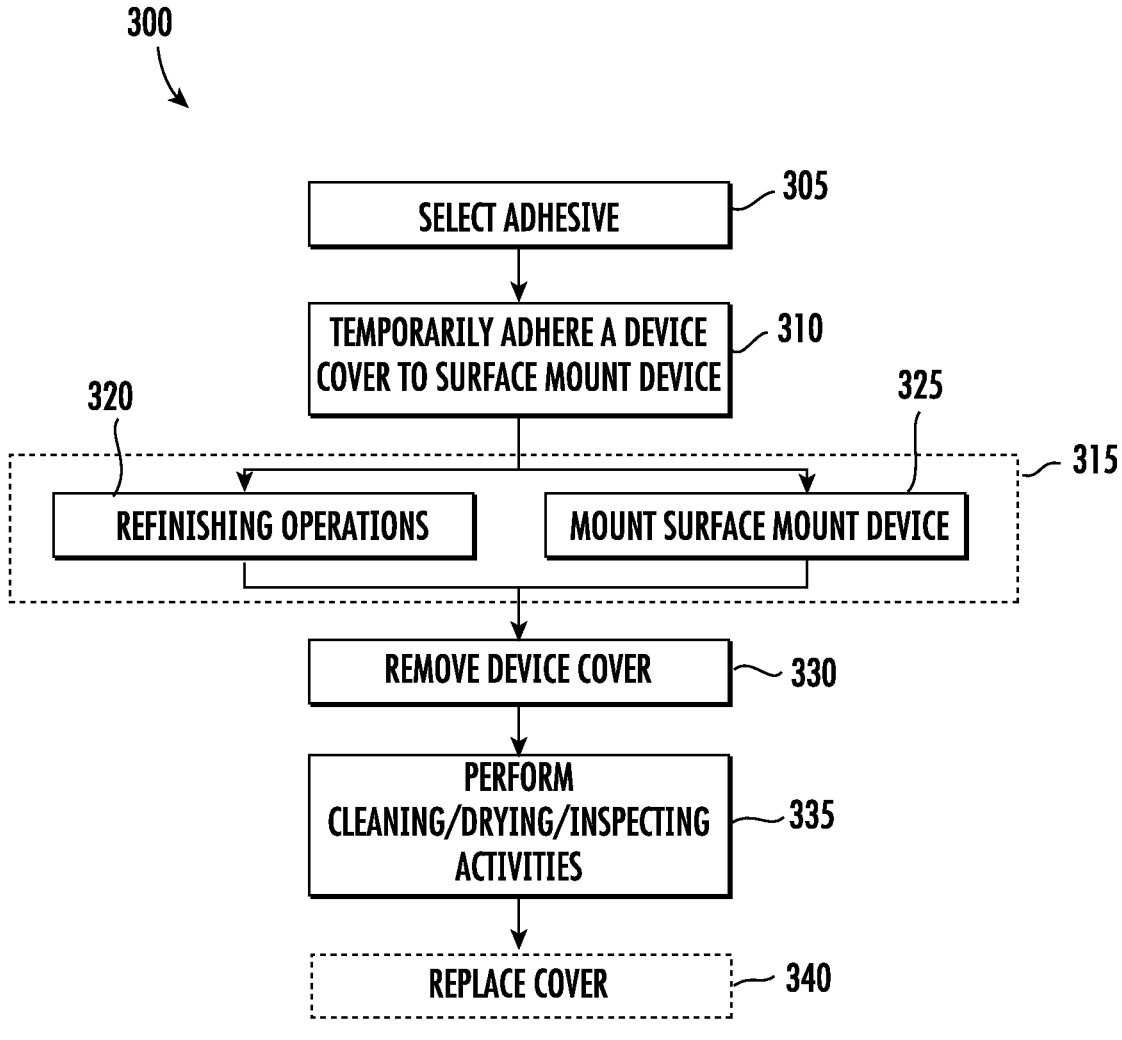
FIG. 3 illustrates an example method of air cavity surface mount package assembly in accordance with some example embodiments described herein.

FIG. 3 illustrates an example method 300 of air cavity surface mount package assembly in accordance with some example embodiments described herein. Any one or more of steps 305, 310, 315, 320, 325, 330, 335, and/or 340 may be optional. As shown in FIG. 3, at step/operation 305, an adhesive is selected. For example, step/operation 305 can include selecting an adhesive for temporarily adhering a device cover to a package base of an air cavity surface mount package. As described herein, the adhesive can be selected based at least in part on a weight and/or an interconnect of the air cavity surface mount package or a host PCB. The adhesive can be intentionally selected to support the removal of the device cover.

In some embodiments, the adhesive can be selected during a design phase of a surface mount assembly process. For example, the air cavity surface mount package can include a particular package type of a plurality of package types. A package type, for example, can be indicative of a particular weight, usage, electrical component structure, and/or one or more other shared characteristics between the air cavity surface mount package and other air cavity surface mount packages. At step/operation 305, an adhesive can be selected for the air cavity surface mount package that can be applicable to other air cavity surface mount packages of the same package type. In such a case, one design phase can be performed once, twice, and/or the like for the particular package type. The adhesive selected during the design phase can then be used during a plurality of respective manufacturing phases for a plurality of air cavity surface mount packages of the same package type.

At step/operation 310, the device cover is temporarily adhered to the air cavity surface mount package. For example, step/operation 310 can include applying the adhesive to temporarily adhere the device cover to the package base of the air cavity surface mount package. In some embodiments, the device cover can be manually and/or robotically adhered to the package base. For example, a robotic device can be loaded with the adhesive and/or instructions for applying a threshold amount of the adhesive. The robotic device can execute the instructions to automatically dispense the threshold amount of the selected adhesive for temporarily adhering the device cover to the air cavity surface mount package.

As described herein, the adhesive can be applied during a manufacturing phase of an air cavity surface mount assembly process. In some embodiments, the design phase can be performed once for a plurality of manufacturing phases for a plurality of air cavity surface mount packages of a particular package type. By way of example, once selected, the adhesive can be applied to a plurality of air cavity surface mount packages (e.g., without repeating the design phase) during a plurality of manufacturing phases of a surface mount assembly process.

At step/operation 315, one or more post-fabrication activities are performed with the air cavity surface mount package. Each post-fabrication activity can utilize the device cover of the air cavity surface mount package to perform one or more operations such as, for example, lifting, moving, placing, and/or the like the air cavity surface mount package. The one or more post-fabrication activities can include one or more refinishing operations, one or more circuit board manufacturing operations, and/or any other operations (e.g., cleaning, etc.) associated with the air cavity surface mount package.

At step/operation 320, for example, one or more refinishing operations can be performed on the air cavity surface mount package with the temporary device cover. The refinishing operations can include applying one or more coats of a finishing material to the air cavity surface mount package. The finishing material, for example, can include a rust resistant, radiation resistant, and/or other resistance fortifying materials that may be applied to the air cavity surface mount package to increase the air cavity surface mount package's lifetime and/or resistance to external forces (e.g., rust, radiation, and/or the like). In some embodiments, such operations can introduce potentially harmful refinishing matter that can be detrimental to the internal electrical components of the air cavity surface mount package.

Optionally, in some embodiments, at step/operation 325, the air cavity surface mount package with a temporary device cover can be mounted to a host PCB. Step/operation 325 may be optionally performed by a circuit board manufacturer and/or another entity. In some embodiments, each of the step/operations of method 300, are performed before mounting the air cavity surface mount package to a host PCB. For example, steps/operations 305, 310, 315, 320, 330, 335, and/or 340 may be performed by a package manufacturer to fabricate, refurbish, and/or perform maintenance on the air cavity surface mount package before it is provided to another entity for placement on a host PCB.

Step/operation 315 can include providing the air cavity surface mount package for a manual and/or robotic PNP circuit board assembly. During the PNP circuit board assembly, the air cavity surface mount package can be manually and/or robotically lifted and/or otherwise moved and placed at a particular position on a host PCB. A robotic PNP circuit board assembly, for example, can utilize a PNP machine that can lift the air cavity surface mount package, such as by the temporarily attached device cover, and place the air cavity surface mount package at a specific location of the host PCB. The air cavity surface mount package can be attached to the host PCB at the specific location during one or more reflow operations. By way of example, during the one or more reflow operations one or more package interconnects can be connected to one or more board interconnects of the host PCB through one or more soldering, heating, and/or adhesion operations. The reflow operations can be performed to electrically connect the air cavity surface mount package to the host PCB. In some embodiments, such operations can introduce potentially harmful fluxes, liquids, and/or other matter such as, for example, soldering flux that can be detrimental to the internal electrical components of the air cavity surface mount package.

At step/operation 330, the device cover can be removed from the package base. The device cover can be removed manually and/or robotically. By way of example, the device cover can be automatically removed by one or more robotic detachment mechanisms capable of applying a force exceeding the attachment strength of the adhesive.

At step/operation 335, one or more cleaning, drying, and/or inspecting activities can be performed. For example, step/operation 330 can include performing one or more washing and/or drying activities for the air cavity surface mount PCB. In some embodiments, the washing activities can introduce cleaning solutions to the air cavity surface mount package that can potentially be harmful to the internal electrical components of the air cavity surface mount package if allowed to remain in close contact with the internal electrical components over time. In addition, or alternatively, the cleaning solution can carry soldering flux from the host PCB (e.g., introduced during one or more reflow operation) and/or refinishing matter (e.g., introduced during one or more refinishing operations) to an air cavity of the air cavity surface mount package. By removing the device cover, this potentially harmful matter can be removed from the air cavity of the air cavity surface mount package after washing the air cavity surface mount package and/or the host PCB to prevent damage to the internal electrical components of the air cavity surface mount package.

At step/operation 340, the device cover can be replaced by reattaching the device cover to the package base of the air cavity surface mount package. By way of example, the device cover can be reattached based at least in part on the fragility of the one or more internal electrical components of the air cavity surface mount package, a use case for the host PCB, and/or any other factor.

FIG. 3 illustrates a flowchart describing the operation of apparatuses, methods, and computer program products according to example embodiments contemplated herein. It will be understood that each flowchart block, and combinations of flowchart blocks, may be implemented by various means, such as hardware, firmware, processor, circuitry, and/or other devices associated with execution of software including one or more computer program instructions. For example, one or more of the operations described above may be implemented by an apparatus executing computer program instructions. In this regard, the computer program instructions may be stored by a memory of the computing device and executed by a processor of the computing device. As will be appreciated, any such computer program instructions may be loaded onto a computer or other programmable apparatus (e.g., hardware) to produce a machine, such that the resulting computer or other programmable apparatus implements the functions specified in the flowchart blocks. These computer program instructions may also be stored in a computer-readable memory that may direct a computer or other programmable apparatus to function in a particular manner, such that the instructions stored in the computer-readable memory produce an article of manufacture, the execution of which implements the functions specified in the flowchart blocks. The computer program instructions may also be loaded onto a computer or other programmable apparatus to cause a series of operations to be performed on the computer or other programmable apparatus to produce a computer-implemented process such that the instructions executed on the computer or other programmable apparatus provide operations for implementing the functions specified in the flowchart blocks.

The flowchart blocks support combinations of means for performing the specified functions and combinations of operations for performing the specified functions. It will be understood that one or more blocks of the flowcharts, and combinations of blocks in the flowcharts, can be implemented by special purpose hardware-based computer systems which perform the specified functions, or combinations of special purpose hardware with computer instructions.

Figure 4:
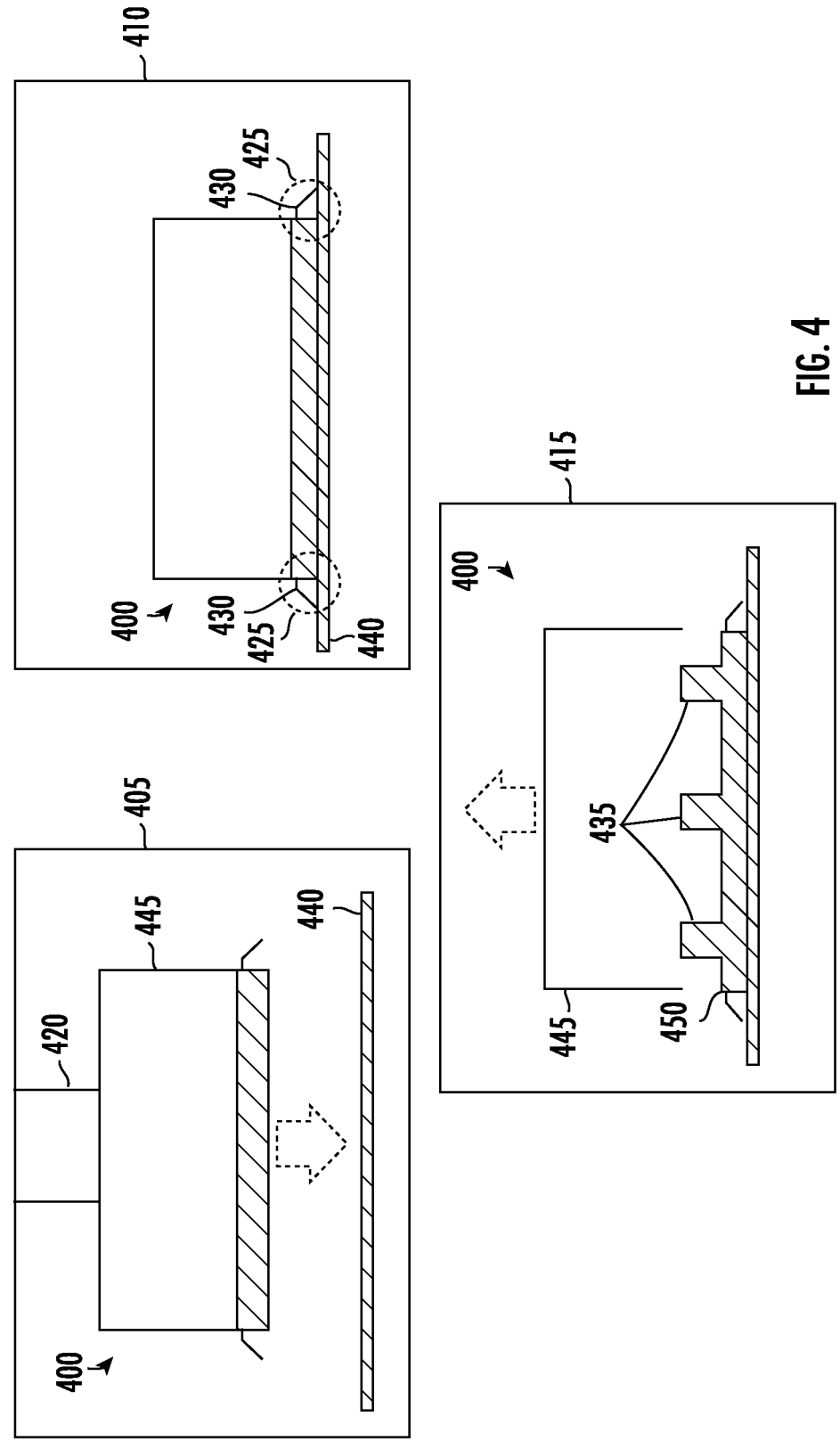
FIG. 4 illustrates an air cavity surface mount package assembly at one or more stages of a circuit board assembly process in accordance with some example embodiments described herein.

FIG. 4 illustrates an air cavity surface mount package 400 at one or more stages of a circuit board assembly process in accordance with some example embodiments described herein. As shown in FIG. 4, the air cavity surface mount package 400 can move between a first stage 405, a second stage 410, and a third stage 415 of a circuit board assembly process. The circuit board assembly process is just one example use case for the air cavity surface mount package 400 with a removable device cover 445. The air cavity surface mount package 400 can move through one or more similar stages during one or more refinishing and/or other processes.

During the first stage 405, the air cavity surface mount package 400 can be manually placed and/or robotically placed (e.g., by a PNP machine 420) at a specific location of the host PCB 440. For example, the first stage 405 can include one or more pick and place operations during which the PNP machine 420 can lift and/or move the air cavity surface mount package 400 using a vacuum suction applied to the removable device cover 445. The air cavity surface mount package 400 can be lifted by the removable device cover 445 and lowered at the location of the PCB 440.

During the second stage 410, the air cavity surface mount package 400 can be electrically attached to the PCB 440. For example, the second stage 410 can include one or more reflow operations 425 (e.g., solder reflow operations, etc.) during which one or more package interconnects 430 (e.g., one or more electrical leads, pins, castellations, paddles, etc.) of the air cavity surface mount package 400 can be electrically attached (e.g., soldered, wire bonded, glued, etc.) to one or more board interconnects (e.g., traces, lands, etc.) of the PCB 440.

During the third stage 415, the removable device cover 445 can be separated from the package base 450. For example, the third stage 415 can be performed to prepare the PCB 440 for one or more cleaning, drying, and/or inspecting activities. Before the one or more cleaning, drying, and/or inspecting activities, the removable device cover 445 can be removed from the package base 450 to expose one or more internal electrical components 435 of the air cavity surface mount package 400.

CONCLUSION

Moreover, many modifications and other embodiments of the present disclosure set forth herein will come to mind to one skilled in the art to which this disclosure pertains having the benefit of the teachings presented in the foregoing descriptions and the associated drawings. Therefore, it is to be understood that the present disclosure is not to be limited to the specific embodiments disclosed and that modifications and other embodiments are intended to be included within the scope of any appended claims. Moreover, although the foregoing descriptions and the associated drawings describe example embodiments in the context of certain example combinations of elements and/or functions, it should be appreciated that different combinations of elements and/or functions can be provided by alternative embodiments without departing from the scope of any appended claims. In this regard, for example, different combinations of elements and/or functions than those explicitly described above are also contemplated as can be set forth in some of any appended claims. Although specific terms are employed herein, they are used in a generic and descriptive sense only and not for purposes of limitation.

What is claimed is:

1. An air cavity surface mount package, comprising:
a package base;
one or more package interconnects disposed at least partially on a carrier substrate of the package base; and
a device cover temporarily adhered to the package base, wherein the device cover is temporarily adhered to the package base by an adhesive comprising a threshold amount of a low strength adhesive material, wherein the adhesive has an adhesive strength that is at least five times a weight of the air cavity surface mount package and less than a threshold force corresponding to a material strength or an attachment strength of the one or more package interconnects.

2. The air cavity surface mount package of claim 1, wherein the adhesive strength achieves a first threshold adhesive strength without exceeding a second threshold adhesive strength.

3. The air cavity surface mount package of claim 2, wherein the first threshold adhesive strength is based at least in part on weight of the air cavity surface mount package.

4. The air cavity surface mount package of claim 2, wherein the second threshold adhesive strength is based at least in part on the one or more package interconnects disposed at least partially on the carrier substrate.

5. The air cavity surface mount package of claim 2, wherein the air cavity surface mount package is electrically attached to a host printed circuit board (PCB) comprising at least one board interconnect and the second threshold adhesive strength is based at least in part on a material strength or an attachment strength of the at least one board interconnect.

6. The air cavity surface mount package of claim 5, wherein at least one of: (i) the threshold amount of low strength adhesive material, or (ii) a type of the low strength adhesive material is based at least in part on the weight of the air cavity surface mount package.

7. The air cavity surface mount package of claim 5, wherein at least one of: (i) the threshold amount of low strength adhesive material, or (ii) a type of the low strength adhesive material is based at least in part on a solder joint strength between at least one of the one or more package interconnects and the at least one board interconnect of the host PCB.

8. The air cavity surface mount package of claim 5, wherein at least one of: (i) the threshold amount of low strength adhesive material, or (ii) a type of the low strength adhesive material is based at least in part on an interconnect adhesive strength of the at least one board interconnect.

9. The air cavity surface mount package of claim 8, wherein the at least one of: (i) the threshold amount of low strength adhesive material, or (ii) the type of the low strength adhesive material is based at least in part on a package interconnect material strength of at least one package interconnect of the one or more package interconnects or a board interconnect material strength of the at least one board interconnect.

10. The air cavity surface mount package of claim 1, wherein the adhesive is disposed proximate to an exterior boundary of the package base.

11. The air cavity surface mount package of claim 10, wherein the threshold amount of low strength adhesive material comprises at least two portions of adhesive material, and wherein the at least two portions of adhesive material are symmetrically spaced at two boundary positions of the exterior boundary.

12. A method comprising:
selecting an adhesive for temporarily adhering a device cover to a package base of an air cavity surface mount package;
applying the adhesive to temporarily adhere the device cover to the package base of the air cavity surface mount package;
providing the air cavity surface mount package for at least one of refinishing or circuit board assembly; and
removing the device cover from the package base.

13. The method of claim 12, wherein the air cavity surface mount package is provided for at least one of: (i) manual circuit board assembly, (ii) robotic circuit board assembly by a pick and place (PNP) machine, or (iii) robotic refinishing using a robotic refinishing machine.

14. The method of claim 13, wherein the air cavity surface mount package is a particular package type of a plurality of package types,
wherein selecting the adhesive comprises selecting, during a design phase, the adhesive for the air cavity surface mount package based at least in part on a weight of the air cavity surface mount package,
wherein applying the adhesive comprises applying, during an air cavity surface mount package manufacturing phase, the adhesive to temporarily adhere the device cover to the package base of the air cavity surface mount package, and
wherein the design phase is performed once for a plurality of manufacturing phases for a plurality of air cavity surface mount packages of the particular package type.

15. The method of claim 14, further comprising:
electrically attaching the air cavity surface mount package to a host printed circuit board.

16. The method of claim 12, further comprising:
reattaching the device cover to the package base.

* * * * *